United States Patent [19]
Tarr et al.

[11] 4,054,853
[45] Oct. 18, 1977

[54] UHF TELEVISION TUNER WITH ELECTRICAL FINE TUNING

[75] Inventors: William A. Tarr; James E. Krepps, both of Bloomington; Thomas L. Opsahl, Fort Wayne, all of Ind.

[73] Assignee: Sarkes Tarzian, Inc., Bloomington, Ind.

[21] Appl. No.: 685,153

[22] Filed: May 11, 1976

[51] Int. Cl.[2] .............................................. H03J 5/12
[52] U.S. Cl. ..................................... 334/15; 325/456; 325/464; 331/177 V; 334/88
[58] Field of Search ....................... 334/15, 47, 49, 51, 334/55, 58, 88; 325/453, 456, 464, 465; 331/177 V; 74/10.41

[56] References Cited
U.S. PATENT DOCUMENTS

| 3,307,414 | 3/1967 | Naber et al. ............... 74/10.41 |
| 3,678,421 | 7/1972 | Ono .................................. 334/15 |
| 3,697,904 | 10/1972 | Mohri et al. ................. 334/51 |
| 3,842,683 | 10/1974 | Valdettaro .................. 74/10.41 |
| 3,878,466 | 4/1975 | Hendrickson ............ 334/15 X |

Primary Examiner—Paul L. Gensler
Attorney, Agent, or Firm—Mason, Kolehmainen, Rathburn & Wyss

[57] ABSTRACT

An electrical fine tuning system for a UHF television tuner utilizes a voltage variable capacitor for adjusting the operating frequency of the oscillator. The capacity of the voltage variable capacitor is determined by a potentiometer that is mounted concentrically with the selector shaft and serves as a fine tuning control. An automatic frequency control voltage may be applied to the voltage variable capacitor used for fine tuning or to a second voltage variable capacitor. Circuitry is provided for extending the tuning range of the voltage variable capacitor when a single voltage variable capacitor is used both for fine tuning and automatic frequency control, and an improved mechanical construction is used to couple the voltage variable capacitors to the oscillator.

29 Claims, 19 Drawing Figures

UHF TELEVISION TUNER WITH ELECTRICAL FINE TUNING

BACKGROUND OF THE INVENTION

A. Field of the Invention

This invention relates to television tuners, and more particularly, to UHF television tuners utilizing voltage variable capacitors to provide fine tuning and automatic frequency control.

B. Description of the Prior Art

UHF television tuners employing voltage variable capacitors for tuning and automatic frequency control are known. One such UHF tuner employs one or more voltage variable capacitors and a plurality of selectable potentiometers for applying a tuning voltage to the voltage variable capacitors. Each potentiometer is adjusted to tune the tuner to a preselected UHF television station, and station selection is achieved by selectively connecting the voltage variable capacitors within the tuner to the potentiometer corresponding to the desired channel. Automatic frequency control is obtained by coupling the automatic frequency control voltage to one of the voltage variable capacitors.

Other prior art UHF television tuners employ a voltage variable capacitor for automatic frequency control, but most utilize a mechanically actuated tuning element to achieve fine tuning, since the fine tuning range provided by voltage variable capacitors tends to be limited.

While these approaches make it possible to provide fine tuning and automatic frequency control for UHF television tuners, the systems using voltage variable capacitors for station selection tend to be inaccurate and prone to drift. Furthermore, a version capable of receiving all seventy UHF channels without readjustment of the tuning potentiometers would be quite complex and costly because of the large number of potentiometers required.

The UHF tuners using mechanically operated components for station selection have better accuracy and permit a seventy channel tuner to be built. One such tuner is described in U.S. Pat. No. 3,842,683. The mechanically tuned tuners utilizing a voltage variable capacitor for automatic frequency control, but retaining a mechanical fine tuning system usually employ a clutch, such as the system described in U.S. Pat. No. 3,774,459. Unfortunately, the clutch tends to slip when the detented selector shaft is turned, and results in a gradual detuning of the tuner. This phenomenon is commonly known as "creep".

SUMMARY OF THE INVENTION

Accordingly, it is an object of the present invention to provide an improved UHF tuner that overcomes many of the disadvantages of the prior art tuners.

It is another object of the present invention to provide a UHF television tuner utilizing mechanical channel selection and electrical fine tuning.

It is yet another object of the present invention to provide a UHF television tuner that eliminates the problem of "creep".

It is still another object of the present invention to provide a highly stable electrically fine tuned UHF television tuner.

Another object of the present invention is to provide an electrically fine tuned UHF television tuner that is operated by the user in the same manner as a mechanically fine tuned television tuner.

Still another object of the present invention is to provide an electrically fine tuned UHF tuner having a seventy position detented tuning shaft for selecting all seventy UHF television channels in the UHF television band.

It is another object of the present invention to provide a UHF tuner employing a single variable voltage capacitor for both automatic frequency control and electronic fine tuning.

It is another object of the present invention to provide an improved mechanical mounting of the voltage variable capacitor to increase the tuning range over which the tuner may be tuned by the voltage variable capacitor.

In accordance with a preferred embodiment of the present invention, a mechanically tunable UHF television tuner having a seventy position detented selector shaft is provided with a voltage variable capacitor coupled to the oscillator circuit of the tuner. The voltage variable capacitor is mounted on a leadless pill type ceramic capacitor that is directly mounted to the chassis of the tuner in order to shorten the length of the leads of the voltage variable capacitor and thereby extend the tuning range of the capacitor. In one embodiment, a single voltage variable capacitor is used to provide both fine tuning and automatic frequency control, and an improved electrical circuit is provided for coupling both the automatic frequency control voltage and the fine tuning voltage to the voltage variable capacitor without substantially diminishing the control range of the automatic frequency control voltage. In another embodiment, two voltage variable capacitors are employed, one for electrical fine tuning and the other for automatic frequency control. When two such voltage capacitors are employed, the conductive disc of the pill type supporting capacitor is split and one of the voltage variable capacitors is attached to each portion of the split disc to provide a solid mounting for the voltage variable capacitors while minimizing lead length and providing electrical isolation between the two variable voltage capacitors. A fine tuning potentiometer having a push-to-engage mechanism and an automatic frequency control defeat switch is mounted concentrically with the selector shaft to permit the tuner to be fine tuned in a manner similar to that of a tuner utilizing a standard mechanical push-to-engage fine tuning system.

DESCRIPTION OF THE DRAWINGS

The above and other objects and advantages of the present invention will be readily apparent from the following specification and enclosed drawings wherein.

DETAILED DESCRIPTION OF THE PREFERRED EMBODIMENT

Figure 1:
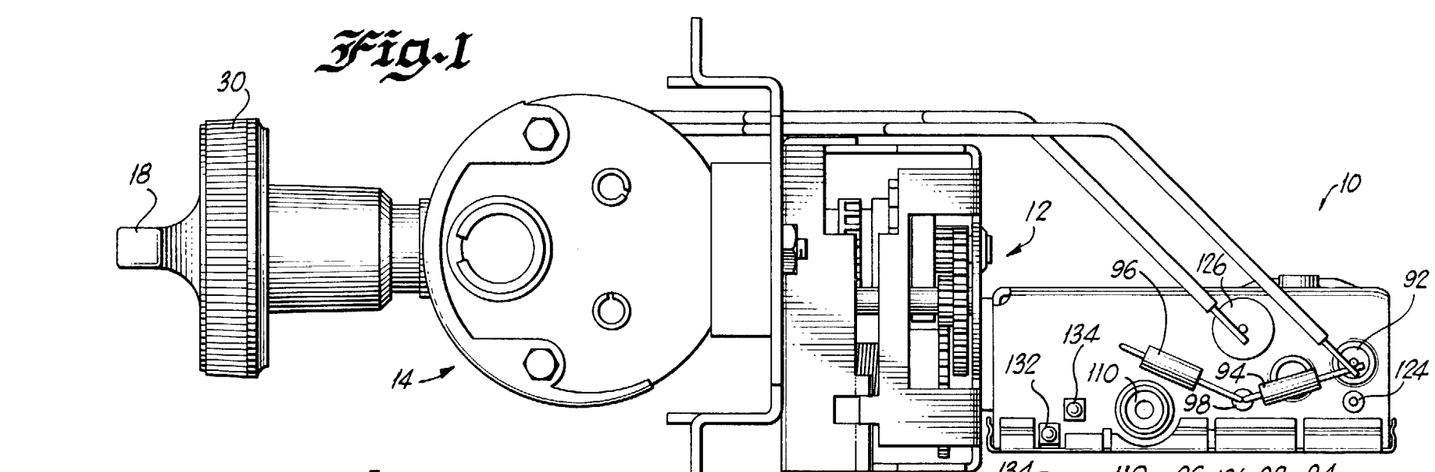
FIG. 1 is a top view of a UHF television tuner employing the principles of the present invention.
Figure 2:
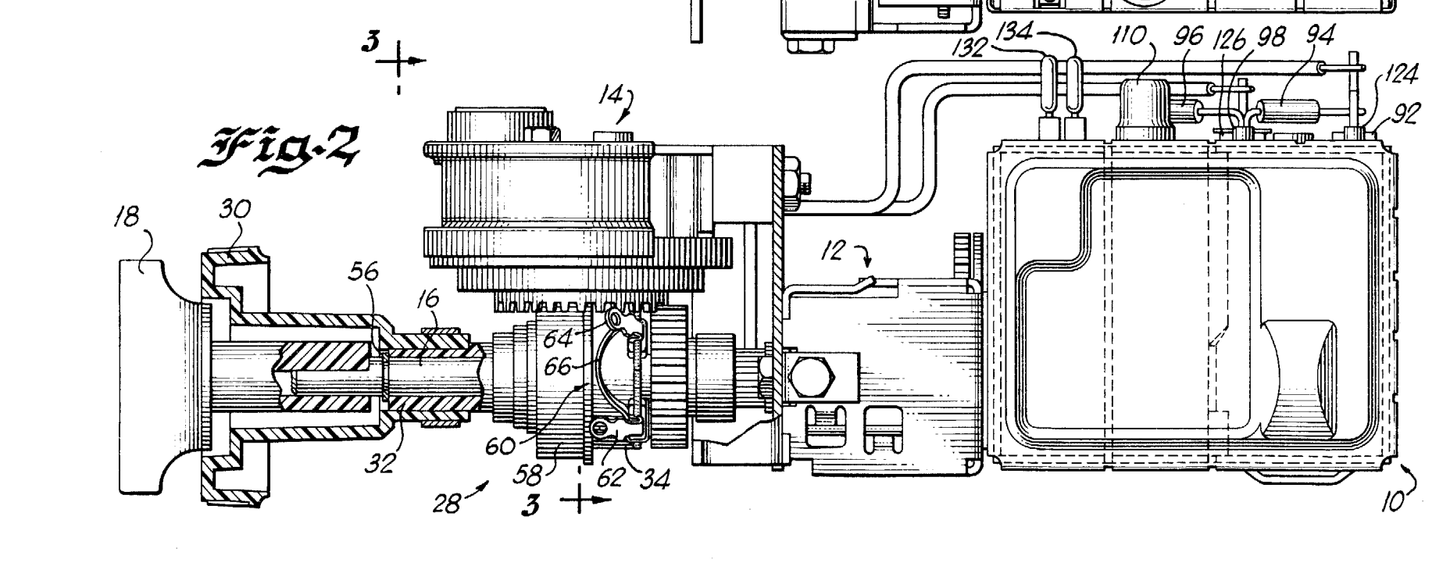
FIG. 2 is a side view of the UHF television tuner illustrated in FIG. 1.
Figure 5:
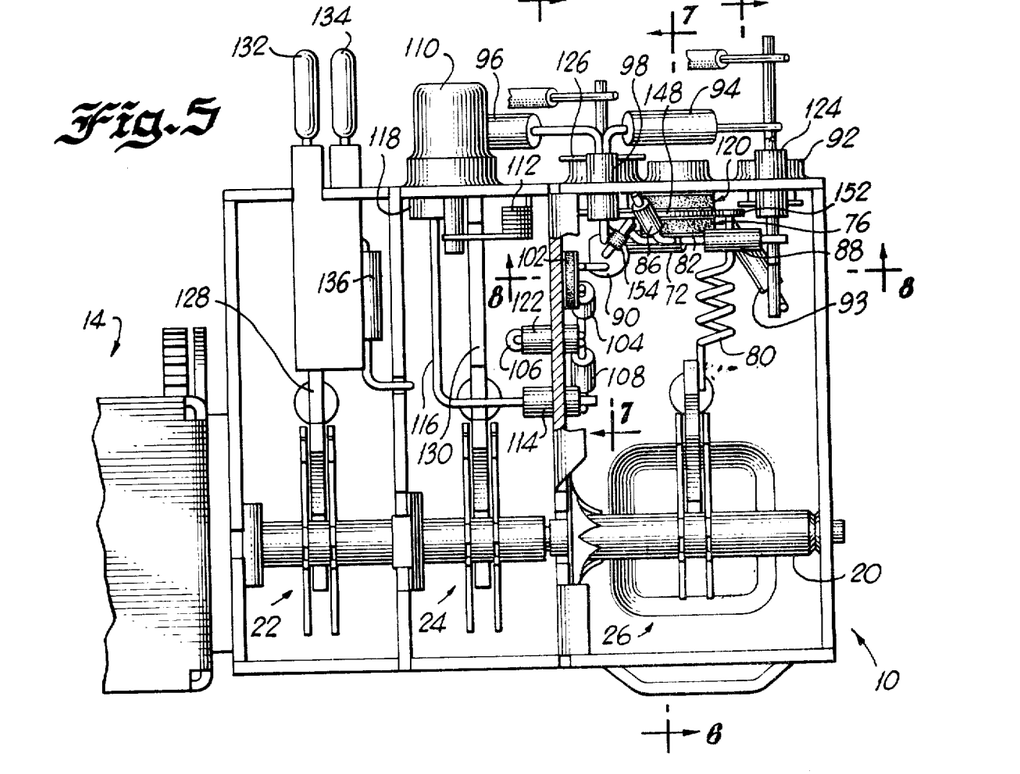
FIG. 5 is a side view of the interior of the tuner showing the mechanical layout of the voltage variable capacitors.

Referring now to the drawings, with particular attention to FIGS. 1 and 2, there is shown an electrically and mechanically tunable UHF tuner generally designated by the reference numeral 10 having a continuously variable tuning shaft and a tuning shaft driving mechanism generally designated by the reference numeral 12. The combination of the tuner 10 and driving mechanism 12 is similar to the apparatus described in U.S. Pat. No. 3,774,459, incorporated herein by reference, except that the mechanical fine tuning shaft has been eliminated, and the clutch coupling the selector shaft to the gear mechanism has been replaced by a solid coupling because the fine tuning function is accomplished electrically in the present system. An indicator mechanism 14 similar to the mechanism described in U.S. Pat. No. 3,916,820, also incorporated herein by reference, is used to indicate the number of the channel to which the tuner is tuned. A selector shaft 16 having a channel selector knob 18 mounted thereon drives the detented driving mechanism 12 which drives a tuning shaft 20 (FIG. 5) having the rotor plates of three variable capacitors 22, 24 and 26 mounted thereon. The driving mechanism 12 provides a step down gear ratio between the selector shaft 16 and the tuning shaft 20, and also provides a plurality of detent positions for the selector shaft 16 (in this embodiment 70, one for each channel in the UHF television band). Each detent position corresponds to a unique position of the tuning shaft 20 and permits channel selection to be effected by the rotation of the selector shaft to the appropriate one of the detent positions.

In accordance with an important aspect of the invention, fine tuning of the tuner 10 is effected by a fine tuning potentiometer assembly 28 that is adjusted by means of a fine tuning knob 30 that is coupled to the potentiometer assembly 28 via a fine tuning shaft 32. The fine tuning potentiometer assembly 28 drives a voltage variable capacitor, such as a capacitance diode, connected in the oscillator circuit of the tuner 10 in order to change the operating frequency of the oscillator, and hence, the frequency to which the tuner is tuned. Because of the basic accuracy of the mechanical tuning elements within the tuner, the amount of correction provided by the voltage variable capacitor is adequate to fine tune the tuner. Furthermore, only the oscillator circuit need be tuned by the voltage variable capacitor, since, as a result of the accuracy of the mechanical tuning components, the amount of tuning provided by the electronic fine tuning system does not shift the received frequency out of the pass band of the RF tuned circuits.

The potentiometer assembly 28 is designed so that the fine tuning operation may be effected by the user in a manner similar to that in a mechanical fine tuning system. Accordingly, the potentiometer assembly 28 is mounted concentrically about the selector shaft 16. In addition, the fine tuning shaft 32 is made axially movable along the selector shaft 16 to provide a push-to-tune function similar to that found in mechanical fine tuning systems.

Figure 3:
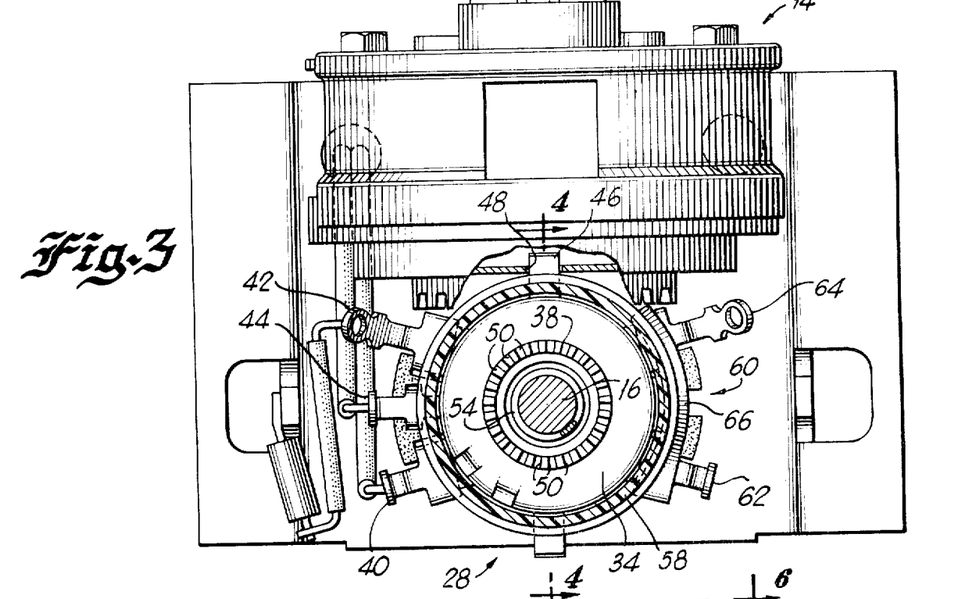
FIG. 3 is a front sectional view of the tuner according to the invention taken along line 3—3 of FIG. 2.
Figures 4, 6, 7, 8, 9, 10:
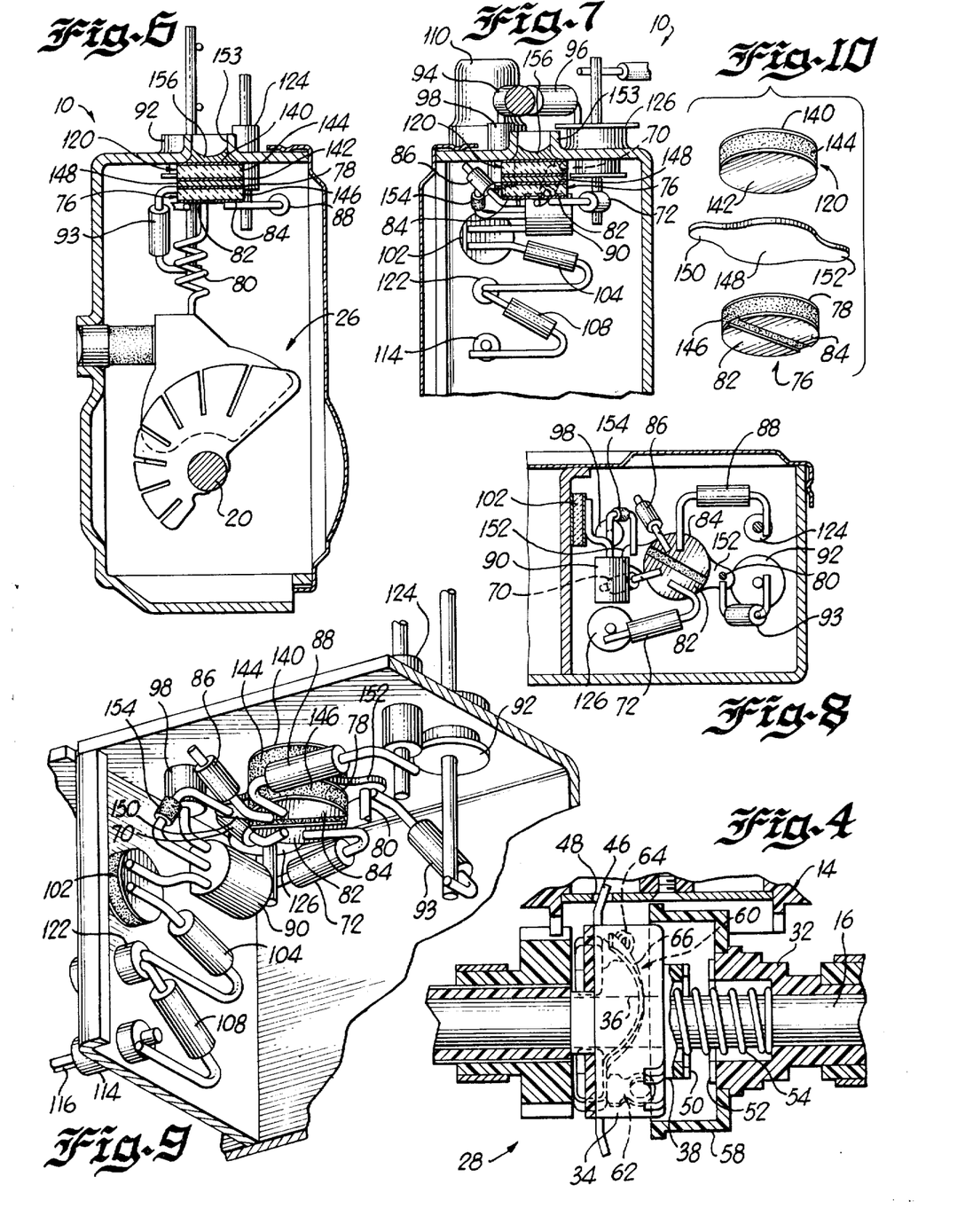
FIG. 4 is a side sectional view of the fine tuning potentiometer of the tuner taken along line 4—4 of FIG. 3.
FIG. 6 is a detailed sectional view of the voltage variable capacitor supporting assembly taken along line 6—6 of FIG. 5.
FIG. 7 is another detailed sectional view of the voltage variable capacitor supporting assembly taken along line 7—7 of FIG. 5.
FIG. 8 is a bottom view of the voltage variable capacitor supporting assembly taken along line 8—8 of FIG. 5.
FIG. 9 is a perspective view of the oscillator transistor and the voltage tunable capacitors.
FIG. 10 is an exploded perspective view of the voltage variable capacitor supporting assembly.

The potentiometer assembly 28, in this embodiment, contains a potentiometer 34 (FIG. 4). The potentiometer 34 is designed to be mounted over the selector shaft 16, and therefore, contains a central aperture 36 for receiving the selector shaft 16 and a hollow resistance adjusting shaft 38 adapted to pass over the selector shaft 16. In addition, the potentiometer 34 contains a standard resistance element and wiper (not shown in the mechanical figures) connected to three terminals 40, 42 and 44 of the potentiometer 34 (FIG. 3). The potentiometer 34 is slidingly mounted on the selector shaft 16, and is secured in place by a tab 46 extending from the potentiometer 34 into the indicator unit 14. The tab 46 engages a slot 48 (FIGS. 3 and 4) formed in the bottom of the indicator unit 14 and prevents the potentiometer 34 from rotating with respect to the selector shaft 16.

The forward facing end of the shaft 38 has a plurality of serrations 50 formed therein for engaging a similar plurality of serrations 52 formed in the end of the fine tuning shaft 32. A spring 54 serves to maintain the opposing serrations 50 and 52 separated, and a ring 56 affixed to the shaft 16 (FIG. 2) limits the maximum amount of forward travel of the shaft 32. A cover 58 affixed to the shaft 32 covers the adjusting shaft 38 and the spring 54. The cover 58 moves both axially and rotatably in conjunction with the fine tuning shaft 32, and is dimensioned to slide over the potentiometer 34 without interference.

In operation, the spring 54 maintains the fine tuning shaft 34 biased in contact with the retaining ring 56, thereby maintaining the serrations 50 and 52 separated. Consequently, any rotation of the fine tuning knob 30 has no effect on the setting of the potentiometer 32 when the fine tuning shaft is thus positioned. When the user decides to fine tune the tuner 10, he merely depresses the fine tuning knob 30 against the force of the spring 54 to bring the serrations 50 and 52 into engagement so that rotation of the fine tuning knob 30 may be imparted to the shaft 38. Consequently, fine tuning is effected in a manner similar to the fine tuning of the mechanical fine tuned systems.

Whenever fine tuning is being effected, it is desirable to disable any automatic frequency control systems that may be operative. Accordingly, the potentiometer assembly 28 is provided with an automatic frequency control defeat switch 60 that is activated by the housing 58 when the fine tuning shaft is moved axially in a rearward direction a sufficient amount to permit the serrations 52 to engage the serrations 50.

The automatic frequency control defeat switch 60 contains a pair of terminals 62 and 64 and a contact 66 fabricated from a resilient conductive material. The contact 66 is biased to provide an open circuit between the terminals 62 and 64, and is engaged by the housing 58 to close the circuit between the terminals 62 and 64 when the fine tuning knob 30 is depressed, thereby disabling the automatic frequency control circuit during the fine tuning operation.

The wiper arm of the potentiometer 34 is connected to a voltage variable capacitor, such as a capacitance diode 70 (FIG. 11) via a decoupling resistor 72. The terminal 40 is connected to a source of positive direct current potential and the terminal 42 is connected to ground through a resistor 74. Consequently, as the position of the wiper arm is varied during the fine tuning operation, a varying reverse biasing potential is applied to the capacitance diode 70, thereby altering the capacitance thereof, and adjusting the frequency of the oscillator circuit tuner 10.

In accordance with an important aspect of the present invention, the capacitance diode 70 is connected to the tank circuit of the oscillator of the tuner 10 via a leadless ceramic capacitor 76 having a plate 78 connected to a tank coil 80 and a plate 82 connected to the capacitance diode 70. A second plate 84 is used to couple a second capacitance diode 86 to the tank circuit of the oscillator. The second capacitance diode 86 is connected to a source of automatic frequency control voltage through a resistor 88.

Figure 11:
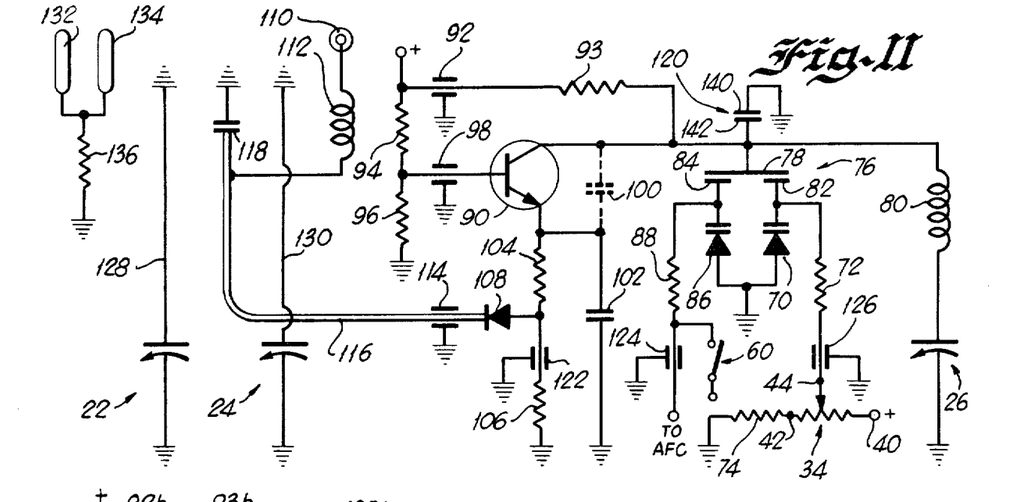
FIG. 11 is a detailed circuit diagram of an embodiment of the UHF television tuner according to the invention utilizing a pair of voltage variable capacitors for automatic frequency control and fine tuning.

The oscillator circuit illustrated in FIG. 11 comprises a transistor 90 that is connected to the tank circuit comprising the mechanically variable capacitor 26 that is attached to the tuning shaft 20, the tank coil 80, the capacitor 76, and the capacitance diodes 70 and 86. The resonsant frequency of the above-mentioned tank circuit determines the operating frequency of the oscillator circuit, which in turn determines the receiving frequency to which the tuner 10 is tuned. The mechanically tunable capacitor 26 tunes the oscillator circuit over its entire range of frequencies to provide station selection and the two capacitance diodes 70 and 86 tune the oscillator over a much narrower range of frequencies, usually less than the six megacycle frequency separation between the channels.

Power is applied to the transistor 90 from a source of positive potential through a feed through capacitor 92 and a base bias is provided by a resistive divider network comprising a pair of resistors 94 and 96. The base bias is applied to the base through a feed through capacitor 98, and collector potential for the transistor 90 is applied through a collector resistor 93. A pair of capacitors 100 and 102 determine the amount of feedback applied to the transistor 90, and because of the high frequencies of operation, the capacitor 100 may simply be the interelectrode capacitance of the transistor 90. The output of the oscillator is inductively coupled to a hot carrier mixer diode 108 by a pair of loops formed in the leads between the diode 108 and a pair of capacitors 114 and 122. A pair of resistors 104 and 106 provide a forward biasing potential for the diode 108. The intermediate frequency output of the mixer diode 108 is applied to an output terminal 110 via a coil 112, a feed through capacitor 114 and a line 116 that is bypassed to ground via a capacitor 118. A capacitor 120 forms part of the tank circuit along with the tank coil 80, the capacitors 26 and 76 and the capacitance diodes 70 and 86. Three feed through capacitors 122, 124 and 126 serve as RF bypass capacitors. The mechanically variable capacitors 22 and 24 operate in conjunction with respective tuned lines 128 and 130 as input tuning circuits for the antenna and mixer circuits. The signal is applied to the tuner via an input circuit comprising a pair of input terminals 132 and 134 and a resistor 136. The characteristics of the input circuits and the mixer circuit are conventional and will not be discussed in detail.

There are many problems associated with the electrical fine tuning of oscillators operating at UHF frequencies. These problems generally result as a consequence of stray inductances and capacitances, and consequently, the electrical components comprising the electrical fine tuning circuit must be arranged very carefully to minimize the stray inductances and capacitances. If this is not done, the range over which the oscillator may be electronically tuned will be unacceptably low, and the oscillator will tend to cease oscillating as the extremes of the tuning range are approached.

Therefore, in accordance with another important aspect of the invention, an improved method of mounting the capacitance diodes 70 and 86 has been devised. The improved mounting structure substantially increases the frequency range over which the oscillator may be tuned by the capacitive diodes 70 and 86, and prevents the oscillator from ceasing operation whenever one of the extremes of the tuning range is approached.

In accordance with a preferred embodiment of the invention, a leadless ceramic capacitor having a pair of plates 140 and 142 metallized onto a disc of ceramic material 144 is utilized as the capacitor 120 (FIGS. 5-10). A similar leadless disc ceramic capacitor is used as the capacitor 76. The plate 78 is metallized onto one side of a pellet of ceramic material 146, and the plates 82 and 84 are formed from a split plate metallized onto the opposite side of the ceramic material 146. A conductive plate 148 is interposed between the capacitors 120 and 76 and serves to connect the plate 142 to the plate 78. In addition, the plate 148 has a pair of tabs 150 and 152 extending therefrom which serve to connect the collector of the transistor 90 to the resistor 93 and the tank coil 80 through the plate 148.

The plates 78 and 142 are soldered to opposite sides of the plate 148, and the plate 140 is soldered directly to the housing of the tuner 10 (FIGS. 5–9). An access opening 153 is provided within the housing to permit solder 156 to be applied to the plate 140 (FIG. 6). The capacitance diodes 70 and 86 have their cathode leads soldered directly to the respective plates 82 and 84 and their anode leads soldered to the housing of the tuner in close proximity to the capacitors 76 and 120. The collector of the transistor 90 is soldered directly to the tab 150, and the tank coil 80 and the resistor 93 are soldered directly to the tab 152. A ferrite bead 154 is placed on the collector lead of the transistor 90 to reduce the possibility of spurious oscillation. The resistors 72 and 88 are also soldered to the respective plates 82 and 84 to provide a connection to the cathode of the respective capacitance diodes 70 and 86.

As can be seen from the drawings, the structure described above provides a highly stable and compact method for mounting the capacitance diodes 70 and 86 and associated circuitry. However, in order to increase the ease with which the mounting assembly may be fabricated, and to reduce the variation between units, the structure illustrated in FIGS. 18 and 19 was developed. In the embodiment illustrated in FIGS. 18 and 19, analogous components have been assigned identical reference numerals, with the reference numerals designating the various components in FIGS. 18 and 19 being followed by suffix "a".

Figures 12, 13, 14, 15, 16, 17, 18, 19:
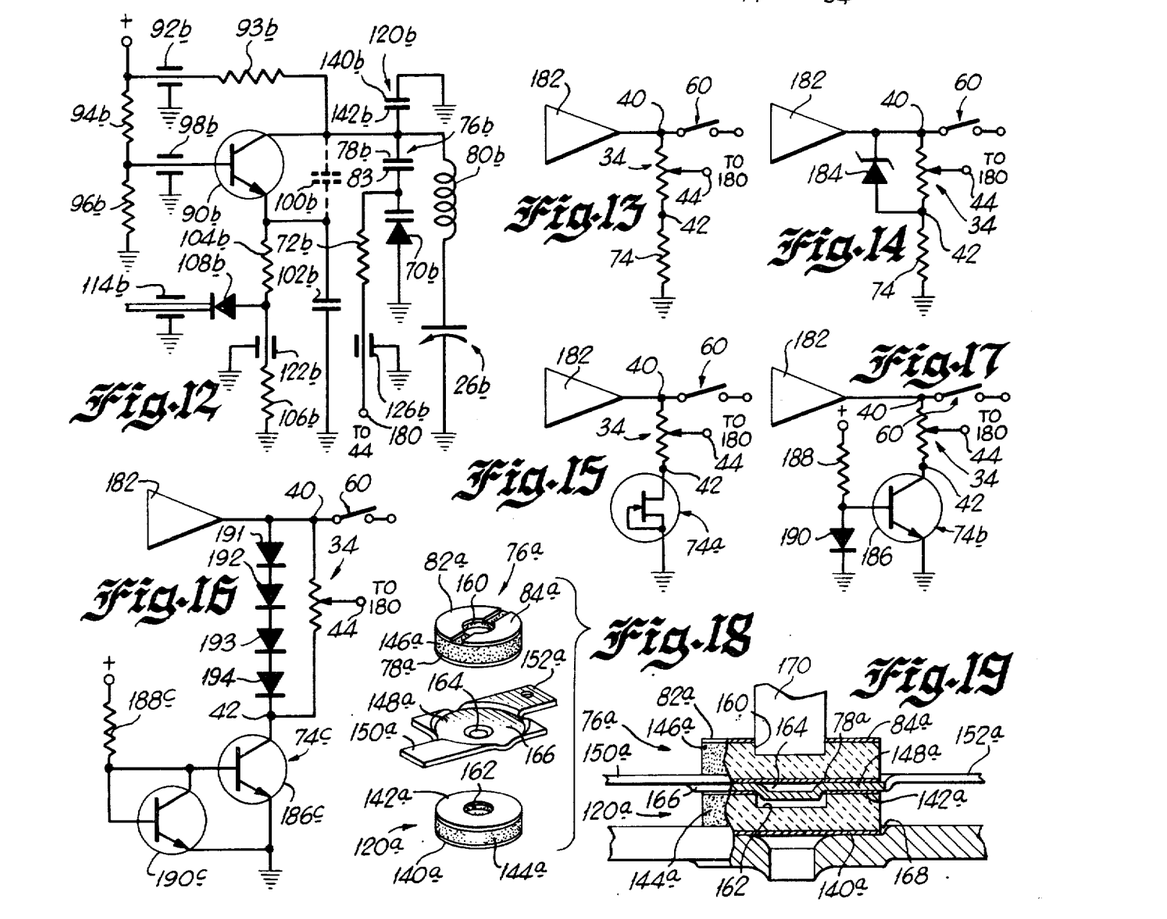
FIG. 12 is a detailed circuit diagram of a portion of an alternative embodiment of the UHF television tuner according to the invention utilizing a single voltage variable capacitor for automatic frequency control and fine tuning.
FIGS. 13–17 are circuit diagrams of various circuits for generating a combined automatic frequency control and fine tuning voltage for application to the circuit illustrated in FIG. 12.
FIG. 18 is an exploded view of an alternative embodiment of the supporting structure illustrated in FIG. 10.
FIG. 19 is a side sectional view of the mounting structure illustrated in FIG. 18.

In the embodiment illustrated in FIGS. 18 and 19, each of the capacitors 76a and 120a has a respective depression 160 and 162 formed therein. A similar depression 164 is formed in the plate 148a and engages the depression 162. A larger depression 166 is also formed in the plate 148a, as is a similar depression 168 in the wall of the housing of the tuner 10. The depressions 166 and 168 serve to locate the respective capacitors 76a and 120a in a coaxial relationship with each other to simplify the manufacturing process. A centering tool 170 may be used to engage the depression 160 to further aid the alignment process during manufacture.

In an alternative embodiment of the invention (FIG. 12), a single diode 70b is used to tune the oscillator in response to both the automatic frequency control voltage and the voltage developed by the fine tuning potentiometer 34. Except that only a single capacitance diode 70b is used in the circuit illustrated in FIG. 12, the circuit is otherwise identical to that illustrated in FIG. 11, and for reasons of simplicity, only the oscillator portion of the circuit is shown. Analogous components in FIG. 11 and 12 are designated by identical reference numerals, with the reference numerals designating the various components being followed by the suffix "b".

The mounting structure for the capacitance diode 70b, comprising capacitors 76b and 120b, may be similar to that illustrated in either FIGS. 5-10 or in FIGS. 18 and 19 except that a continuous plate, designated by the reference numeral 83 in FIG. 12 is used in place of the split plates 82 and 84 or 82a and 84a. The embodiment illustrated in FIG. 12 has the advantage that only a single capacitance diode 70b need be used, thereby reducing the cost and complexity of the tuner. However, circuitry must be provided for combining the automatic frequency voltage and the fine tuning voltage for application to an input point 180 of the circuit in FIG. 12. This can be most readily accomplished by a circuit such as the circuit illustrated in FIG. 13.

In the circuit illustrated in FIG. 13, a conventional automatic frequency controlled amplifier 182 has an output connected to the series combination of the potentiometer 34 and the resistor 74. Any standard amplifier designed for automatic frequency control applications, such as, for example, the CA3064 amplifier manufactured by the Solid State Division of RCA specifically for automatic frequency control applications, may be used. Such an amplifier typically provides a positive voltage at its output that varies in accordance with the state of tuning of the receiver. In a typical receiver, the output of the automatic frequency control amplifier 182 will be approximately 7 volts when the receiver is tuned on center frequency. This voltage might vary approximately ±2 volts about the 7 volt level as the receiver is tuned about the center frequency. In the CA3064 amplifier used as an example, two out of phase outputs are available; one providing an increasing output voltage and the other providing a decreasing output voltage as the receiver is tuned in a particular direction. However, for purposes of clarity, only one output is illustrated in FIGS. 13-17.

In the circuit illustrated in FIG. 13, the output voltage from the amplifier 182 also serves as the fine tuning voltage since any adjustment of the potentiometer will be reflected as a change in the voltage applied to the point 180. Unfortunately, adjusting the potentiometer also affects the sensitivity of the circuit to any change in the automatic frequency control voltage. For example, if the fine tuning potentiometer 34 is adjusted so that the wiper is at the top of the resistive element near the terminal 40, i.e., connected directly to the output of the amplifier 182, any change in the output voltage of the amplifier 182 will be directly applied to the input point 180 (FIG. 12) and result in full automatic frequency control sensitivity. If, however, the fine tuning potentiometer 34 is adjusted near the bottom of the resistive element, for example, near the terminal 42, any change in the voltage applied to the input point 180 resulting from a given change in the output of the amplifier 182 will be reduced by an amount proportional to the ratio of the resistance of the resistor 74 divided by the total resistance of the potentiometer 34 added to the resistance of the resistor 74. Consequently, by way of example, if the total resitance of the potentiometer 34 is approximately equal to the resitance of the resistor 74, then any change in voltage applied to the input point 180 resulting from a change in the output of the amplifier 182 will be reduced by a factor of two, and the automatic frequency control sensitivity halved.

Accordingly, in order to reduce the tendency for the above-described voltage divider effect from altering the automatic frequency control sensitivity, it would be desirable to make the total resitai ce of the potentiometer 34 small relative to the resitance of the resistor 74. Unfortunately, this would excessively reduce the fine tuning range available from the potentiometer 34, and any attempt to reduce the variation automatic frequency control sensitivity utilizing the circuit of FIG. 13 would necessitate a compromise between automatic frequency control sensitivity variations and fine tuning range.

In order to overcome some of the problems associated with the circuit of FIG. 13, the embodiment illustrated in FIG. 14 utilizes a Zener diode 184 connected in parallel with the potentiometer 34. If the breakdown voltage of the Zener diode 184 is selected to be lower than the minimum output of the amplifier 182, then the Zener diode 184 will be maintained in a conductive state and conduct any change in the output voltage of the amplifier 182 to the terminal 42, offset only by the breakdown voltage of the Zener 184. Consequently, any change in voltage resulting in a change in the output voltage of the amplifier 182 will be reflected equally at both of the terminals 40 and 42 of the potentiometer 34. This voltage change will, therefore, also be reflected at the wiper terminal 44 regardless of the setting of the potentiometer 34. Consequently, full automatic frequency control sensitivity will be maintained regardless of the setting of the potentiometer 34. Furthermore, the full fine tuning range will be maintained if the breakdown voltage of the Zener diode 184 is chosen to be approximately equal to the minimum output voltage expected from the amplifier 182, since such a breakdown value will maintain a sufficiently high voltage across the potentiometer 34 to provide the desired fine tuning range.

In yet another embodiment (FIG. 15) a field effect constant current source 74a is used in place of the resistor 74. When such a constant current source is used, the current flowing through the resistive element of the potentiometer 34 is maintained constant regardless of the output voltage of the amplifier 182. Consequently, the voltage drop between the terminals 40 and 42 remains constant, and this being the case, any change in voltage applied to the terminal 40 must be reflected as an identical change in voltage at the output terminal 42. Consequently, any change in voltage appearing at the terminal 44 as a result of a change in the output voltage of the amplifier 182 will be independent of the setting of the potentiometer 34.

A similar embodiment is illustrated in FIG. 17. In the embodiment illustrated in FIG. 17, a constant current source 74b utilizing a transistor 186 biased as a constant current source by a resistor 188 and a diode 190 is used in place of the field effect current source 74a. The theory of operation of the circuit illustrated in FIG. 17 is identical to that of the circuit illustrated in FIG. 15. The circuit illustrated in FIG. 16 combines the techniques of the circuits illustrated in FIG. 14 and in FIGS. 15 and 17. In the circuit illustrated in FIG. 16, four forward biased diodes 191-194 are connected in parallel with the potentiometer 34. The diodes 191-194 operate in a manner similar to that of the Zener diode 184 (FIG. 14) to maintain a substantially constant voltage (equal to the four forward junction drops of the diodes 191-194) across the potentiometer 34. In addition, a constant current source 74c utilizing a transistor 186c, biased as a constant current source by a resistor 188c and a second transistor 190c operating as a diode, maintains a substantially constant current through the diodes 191-194 and the resistive element of the potentiometer 34. This constant current further stabilizes the voltage appearing across the potentiometer 34, and reduces the sensitivity of the automatic frequency control voltage to the setting of the potentiometer 34 even farther.

As previously discussed, it is desirable to disable the automatic frequency control voltage when the receiver is being tuned. This may be readily accomplished by connecting the switch 60 (in some cases, through a suitable current limiting resistor) between the output of the automatic frequency control amplifier 182 and a reference voltage having a value nominally equal to the value of the output voltage of the amplifier 182 when the receiver is tuned to center frequency. However, when an amplifier having out of phase outputs, such as the previously mentioned CA3064, is used as an automatic frequency control detector and amplifier, the automatic frequency control can be effectively defeated simply by connecting the switch 60 across the out of phase outputs (through a current limiting resistor, if necessary) so that the outputs may be switchably connected together to provide an output voltage equal to the average value of the two out of phase output voltages. As a result, the combined output voltage will not change since the voltage of one of the out of phase outputs will increase by an amount substantially equal to the decrease in voltage of the other output. This will result in a substantially constant voltage being applied to the terminal 40, and effectively defeat the operation of the automatic frequency control system.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A UHF television tuning system comprising:
   a UHF tuner having a housing, a continuously variable main tuning shaft rotation of which is effective to cause said tuner selectively to receive signals on all channels in the UHF television band, a channel selector shaft, means interconnecting said selector shaft and said main tuning shaft, detent means for said selector shaft for establishing a stop position of said main tuning shaft for each of the television channels in the UHF band, a mechanically variable capacitor mechanically coupled to said tuning shaft, a variable frequency oscillator electrically coupled to said mechanically variable capacitor and having a frequency of oscillation that is adjustable upon rotation of said main tuning shaft over a range of frequencies corresponding to the entire UHF television band for determining the frequency of the signal received by said UHF tuner;
   a leadless capacitor having first and second plates separated by an insulating material mounted within said housing in close proximity to said oscillator;
   a voltage variable capacitor electrically coupled to said oscillator for controlling the frequency of said oscillator to fine tune said tuner independently of the operation of said main tuning shaft, said voltage variable capacitor being connected to said first plate of said leadless capacitor and mechanically supported thereby in close proximity to said oscillator; and
   a fine tuning potentiometer electrically coupled to said voltage variable capacitor for effecting fine tuning of said tuner.

2. A UHF television tuning system as recited in claim 1 wherein said leadless capacitor is cylindrically shaped and has first and second opposing conductive plates separated by an insulating material, and wherein said first plate is soldered to said voltage variable capacitor.

3. A UHF television tuning system as recited in claim 2 further including a second leadless capacitor having first and second conductive plates separated by an insulating material, said first plate of said second leadless capacitor being connected to said second plate of said leadless capacitor, and said second plate of said second leadless capacitor being affixed to said housing, said second leadless capacitor thereby serving to support said leadless capacitor and providing a capacitive coupling between said housing and said leadless capacitor.

4. A UHF television tuning system as recited in claim 3 further including a conductive plate interposed between said second conductive plate of said leadless capacitor and said first conductive plate of said second leadless capacitor, said interposed conductive plate having a protrusion extending therefrom electrically connected to said oscillator.

5. A UHF television tuning system as recited in claim 2 wherein said tuning system includes a second voltage variable capacitor electrically coupled to said oscillator, and wherein said first plate of said leadless capacitor is split into two sections, said voltage variable capacitor being soldered to one of said sections and said second voltage variable capacitor being soldered to the other one of said sections.

6. A UHF television tuning system as recited in claim 1 wherein said potentiometer is concentrically mounted over said selector shaft.

7. A UHF television tuning system as recited in claim 6 further including a fine tuning shaft concentrically mounted about the outside of said selector shaft, and means mechanically coupling said fine tuning shaft to said potentiometer.

8. A UHF television tuning system as recited in claim 7 wherein said coupling means includes means for engaging said potentiometer affixed to said tuning shaft and disposed adjacent to said potentiometer, and resilient biasing means separating said potentiometer and said engaging means, said fine tuning shaft being slidably mounted on said selector shaft and responsive to axial pressure for bringing said engaging means into engagement with said potentiometer against the force of said resilient biasing means.

9. A UHF television tuning system as recited in claim 8 further including an automatic frequency control defeat switch disposed adjacent to said potentiometer and actuated by axial movement of said fine tuning shaft.

10. A UHF television tuning system as recited in claim 5 further including means coupled to said second voltage variable capacitor for coupling said second voltage variable capacitor to a source of automatic frequency control signals.

11. A UHF television tuning system as recited in claim 1 further including means coupled to said voltage variable capacitor for applying an automatic frequency control voltage from an automatic frequency control source to said voltage variable capacitor.

12. A UHF television tuning system as recited in claim 11 wherein said coupling means includes said potentiometer, a substantially constant voltage reference connected in parallel with said potentiometer and a load impedance connected in series with one junction of said potentiometer and reference voltage source, the source of automatic frequency voltage being connected to the other junction of said reference voltage source and said potentiometer.

13. A UHF television tuning system as recited in claim 12 wherein said reference voltage source includes a Zener diode.

14. A UHF television tuning system as recited in claim 12 wherein said load impedance includes a constant current source.

15. A UHF television tuning system as recited in claim 12 wherein said reference voltage source includes a forward biased diode.

16. A UHF television tuning system as recited in claim 11 wherein said coupling means includes said potentiometer and a constant current source connected to one terminal of said potentiometer, and wherein said source of automatic frequency control voltage is connected to the other terminal of said potentiometer.

17. A UHF television tuning system as recited in claim 16 wherein said constant current source includes a transistor.

18. A UHF television tuning system as recited in claim 15 wherein said constant current source includes a field effect device.

19. A UHF television tuning system operable in conjunction with a source of automatic frequency control signals comprising:
a UHF television tuner having a continuously variable tuning shaft, rotation of which is effective to tune said tuner over the entire UHF television band;
a channel selector shaft mechanically coupled to said tuning shaft;
means for establishing a plurality of detent positions for said selector shaft corresponding to different ones of the UHF television channels;
a voltage variable capacitor electrically coupled to said tuner, said voltage variable capacitor being operative to fine tune said tuner;
a fine tuning potentiometer having first and second end terminals and a wiper terminal, said wiper terminal being direct current coupled to said voltage variable capacitor, one of said end terminals being direct current coupled to said source of automatic frequency control signals, said fine tuning potentiometer being operative to couple varying amounts of said automatic frequency control signal to said voltage variable capacitor to effect fine tuning to said tuner in response to an adjustment of said potentiometer; and
means electrically coupled to at least one of said end terminals of said potentiometer for maintaining a substantially constant voltage between said end terminals over a predetermined range of values of the automatic frequency control signal, thereby causing changes in the value of the automatic frequency control signal applied to said one of said end terminals to be transferred to said wiper terminal substantially independently of the adjustment of said potentiometer.

20. A UHF television tuning system as recited in claim 19 wherein said substantially constant voltage maintaining means includes a substantially constant voltage reference source connected between said end terminals of said potentiometer.

21. A UHF television tuning system as recited in claim 20 wherein said reference source includes a Zener diode.

22. A UHF television tuning system as recited in claim 20 wherein said reference source includes a plurality of series connected forward biased diodes.

23. A UHF television tuning system as recited in claim 19 wherein said substantially constant voltage maintaining means includes means connected in series with the end terminals of said potentiometer for maintaining a substantially constant current through said potentiometer.

24. A UHF television tuning system as recited in claim 23 wherein said constant current providing means includes a constant current source.

25. A UHF television tuning system as recited in claim 19 further including a switch operative to defeat the operation of said source of automatic frequency control signals disposed adjacent to said potentiometer.

26. A UHF television tuning system comprising:
a UHF tuner having a housing, a continuously variable main tuning shaft rotation of which is effective to cause said tuner selectively to receive signals on all channels in the UHF television band, a channel selector shaft, means interconnecting said selector shaft and said main tuning shaft, detent means for said selector shaft for establishing a stop position of said main tuning shaft for each of the television channels in the UHF band, a mechanically variable capacitor mechanically coupled to said main tuning shaft, a variable frequency oscillator electrically coupled to said mechanically variable capacitor and having a frequency of oscillation that is adjustable upon rotation of said main tuning shaft over a range of frequencies corresponding to the entire UHF television band for determining the frequency of the signal received by the UHF tuner;
a voltage variable capacitor electrically coupled to said oscillator for controlling the frequency of said oscillator and fine tuning said tuner independently of the operation of said main tuning shaft;

a fine tuning potentiometer concentrically mounted over said selector shaft and electrically coupled to said voltage variable capacitor for effecting fine tuning of said tuner;

a fine tuning shaft concentrically mounted about the outside of said selector shaft; and cooperating means including first and second opposed engaging members disposed concentrically about said selector shaft, said first engaging member being disposed on said fine tuning shaft and said second engaging member being disposed on said potentiometer for permitting direct engagement of said potentiometer by said fine tuning shaft, said fine tuning shaft being slidingly mounted on said selector shaft and axially movable to a first position in which said engaging members are engaged and solely effective to interconnect said fine tuning shaft and said potentiometer, and to a second position in which said engaging members are disengaged, thereby disengaging said fine tuning shaft from said potentiometer.

27. A UHF television tuning system as recited in claim 26 wherein said cooperating means includes resilient biasing means normally separating said engaging members, said fine tuning shaft being responsive to axial pressure for bringing said engaging members into engagement against the force of said resilient biasing means.

28. A UHF television tuning system as recited in claim 26 further including an automatic frequency control defeat switch disposed adjacent to said potentiometer and actuated by axial movement by said fine tuning shaft.

29. A UHF television tuning system as recited in claim 26 wherein said first and second opposed engaging members include first and second opposed radially extending serrations.

* * * * *